United States Patent
Tutt et al.

(10) Patent No.: US 8,409,937 B2
(45) Date of Patent: Apr. 2, 2013

(54) PRODUCING TRANSISTOR INCLUDING MULTI-LAYER REENTRANT PROFILE

(75) Inventors: Lee W. Tutt, Webster, NY (US); Shelby F. Nelson, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 12/986,247

(22) Filed: Jan. 7, 2011

(65) Prior Publication Data

US 2012/0178247 A1 Jul. 12, 2012

(51) Int. Cl.
*H01L 29/786* (2006.01)
*H01L 21/84* (2006.01)

(52) U.S. Cl. ........ 438/156; 438/157; 438/586; 438/592; 438/595; 438/652; 438/666; 438/669; 438/754; 257/329; 257/347

(58) Field of Classification Search .......... 438/699, 438/479, 710, 714, 670, 157; 257/355, 24, 257/E27.014, E29.07, 401, 53, 366
See application file for complete search history.

(56) References Cited

U.S. PATENT DOCUMENTS

| | | | |
|---|---|---|---|
| 5,641,694 A | 6/1997 | Kenney | |
| 5,849,641 A * | 12/1998 | Arnett et al. | 438/734 |
| 6,972,461 B1 | 12/2005 | Chen et al. | |
| 7,413,982 B2 | 8/2008 | Levy | |
| 7,456,429 B2 | 11/2008 | Levy | |
| 7,571,529 B2 | 8/2009 | Sirringhaus et al. | |
| 7,586,130 B2 | 9/2009 | Kawashima et al. | |
| 7,592,218 B2 | 9/2009 | Brown | |
| 7,629,633 B2 | 12/2009 | Chan et al. | |
| 7,923,313 B1 * | 4/2011 | Tutt et al. | 438/156 |
| 2005/0164464 A1 | 7/2005 | Hecht et al. | |
| 2006/0261331 A1 * | 11/2006 | Yukawa | 257/40 |
| 2006/0263311 A1 * | 11/2006 | Scavone et al. | 424/66 |
| 2007/0015370 A1 * | 1/2007 | Monoe et al. | 438/710 |
| 2007/0131998 A1 | 6/2007 | Lin et al. | |
| 2008/0001148 A1 * | 1/2008 | Nishi et al. | 257/53 |
| 2008/0149913 A1 | 6/2008 | Tanaka et al. | |
| 2008/0166884 A1 | 7/2008 | Nelson et al. | |
| 2009/0001470 A1 | 1/2009 | Anderson et al. | |
| 2009/0032803 A1 * | 2/2009 | Appenzeller et al. | 257/24 |
| 2009/0130858 A1 | 5/2009 | Levy | |
| 2009/0166725 A1 | 7/2009 | Lee | |
| 2009/0194826 A1 * | 8/2009 | Ernst et al. | 257/401 |

FOREIGN PATENT DOCUMENTS

| | | |
|---|---|---|
| JP | 63-170971 | 7/1988 |
| JP | 2-140863 | 11/1990 |
| JP | 05-144744 | 6/1993 |
| JP | 2005-203395 | 7/2005 |

(Continued)

*Primary Examiner* — Olik Chaudhuri
*Assistant Examiner* — Wilner Jean Baptiste
(74) *Attorney, Agent, or Firm* — William R. Zimmerli

(57) ABSTRACT

A method of producing a transistor includes providing a substrate including in order a first electrically conductive material layer, a second electrically conductive material layer, and a third electrically conductive material layer. A resist material layer is deposited over the third electrically conductive material layer. The resist material layer is patterned to expose a portion of the third electrically conductive material layer. Some of the third electrically conductive material layer is removed to expose a portion of the second electrically conductive material layer. The third electrically conductive material layer is caused to overhang the second electrically conductive material layer by removing some of the second electrically conductive material layer. Some of the first electrically conductive material layer is removed.

12 Claims, 8 Drawing Sheets

FOREIGN PATENT DOCUMENTS

| | | |
|---|---|---|
| JP | 2007-284766 | 11/2007 |
| JP | 2008-103636 | 5/2008 |
| KR | 2009-0017045 | 2/2009 |
| KR | 2009-0017046 | 2/2009 |
| WO | WO 89/05516 | 6/1989 |

* cited by examiner

US 8,409,937 B2

PRODUCING TRANSISTOR INCLUDING MULTI-LAYER REENTRANT PROFILE

CROSS REFERENCE TO RELATED APPLICATIONS

Reference is made to commonly-assigned, U.S. patent application Ser. No. 12/986,241, entitled "TRANSISTOR INCLUDING MULTI-LAYER REENTRANT PROFILE", and Ser. No. 12/986,251, entitled "ACTUATING TRANSISTOR INCLUDING MULTI-LAYER REENTRANT PROFILE", all filed concurrently herewith.

FIELD OF THE INVENTION

This invention relates generally to semiconductor devices, and in particular to transistor devices.

BACKGROUND OF THE INVENTION

In semiconductor processing technology, planar substrate surfaces which are horizontal with respect to a wafer surface are patterned by photolithographic methods in combination with selective etching processes. During the processing of integrated circuits, reliefs with a pronounced topography are formed on the wafer or substrate surface. Typically, this type of relief includes surfaces which are inclined or vertical with respect to the substrate surface. As sizes of integrated circuits continue to shrink, it is becoming more and more necessary to pattern vertical or inclined device surfaces so as to functionally differentiate these devices over their vertical extent while still maintaining pattern alignment. Examples of these types of semiconductor devices include deep trench capacitors, stacked capacitors, and vertical transistors.

Currently, it is not possible to put patterns directly on walls which are vertical with respect to the substrate surface using conventional photolithographic techniques. Usually, vertical wall patterning of this nature is accomplished using a suitable filler material which, when partially filling in a trench, acts as a mask for the portions of the wall located underneath while allowing for processing of the walls above the filler material. For example, when an oxide is to be deposited exclusively on vertical walls below a filler material, the oxide is first deposited or produced over the entire surface of the relief. The relief or trench is initially completely filled with a suitable filler material. Then, the filler material is recessed back to a depth that just covers the desired oxide. After uncovered sections of the oxide are removed, the remaining filler material is removed.

Alternatively, when an oxide is to be deposited or produced only in upper regions of a vertical wall, an etching stop layer, for example, a nitride layer is first provided over the entire surface of the entire relief pattern. A different material, susceptible to directional etching, for example, polycrystalline silicon, is used to fill the relief, and is etched back as far as the desired coverage depth of the final vertical oxide. After the etching stop layer is removed from the unfilled sections of the walls, an oxide is deposited or generated using a thermal technique in the uncovered regions. Next, the oxide is anisotropically etched which removes the deposited oxide from horizontal. This is followed by removal of the filler material and, then, the removal of the etching stop layer.

There are deposition processes which can be used to deposit thin films on vertical or inclined surfaces of a substrate relief. However, it is difficult to control the thickness of the layer deposited. Typically, the thickness of the coating decreases as the depth of the relief increases, for example, as the length of the vertical or inclined wall increases. As such, layers deposited using these types of deposition processes have considerable differences in thickness over the length of the relief. These types of deposition processes include plasma-enhanced chemical vapor deposition (PECVD) and diffusion-limited deposition of silicon oxide using tetraethyl orthosilicate (TEOS).

As such, there is an ongoing need to provide semiconductor device architectures that include patterned vertical or inclined device surfaces. There is also an ongoing need to provide manufacturing techniques capable of processing small device features of semiconductor devices without requiring high resolution alignment tolerances. There is also an ongoing need to provide higher current semiconductor devices by improving the series resistance of the device.

SUMMARY OF THE INVENTION

According to one aspect of the present invention, a method of producing a transistor includes providing a substrate including in order a first electrically conductive material layer, a second electrically conductive material layer, and a third electrically conductive material layer. A resist material layer is deposited over the third electrically conductive material layer. The resist material layer is patterned to expose a portion of the third electrically conductive material layer. Some of the third electrically conductive material layer is removed to expose a portion of the second electrically conductive material layer. The third electrically conductive material layer is caused to overhang the second electrically conductive material layer by removing some of the second electrically conductive material layer. Some of the first electrically conductive material layer is removed.

BRIEF DESCRIPTION OF THE DRAWINGS

In the detailed description of the preferred embodiments of the invention presented below, reference is made to the accompanying drawings, in which.

DETAILED DESCRIPTION OF THE INVENTION

The present description will be directed in particular to elements forming part of, or cooperating more directly with, apparatus in accordance with the present invention. It is to be understood that elements not specifically shown or described may take various forms well known to those skilled in the art.

Figure 1:
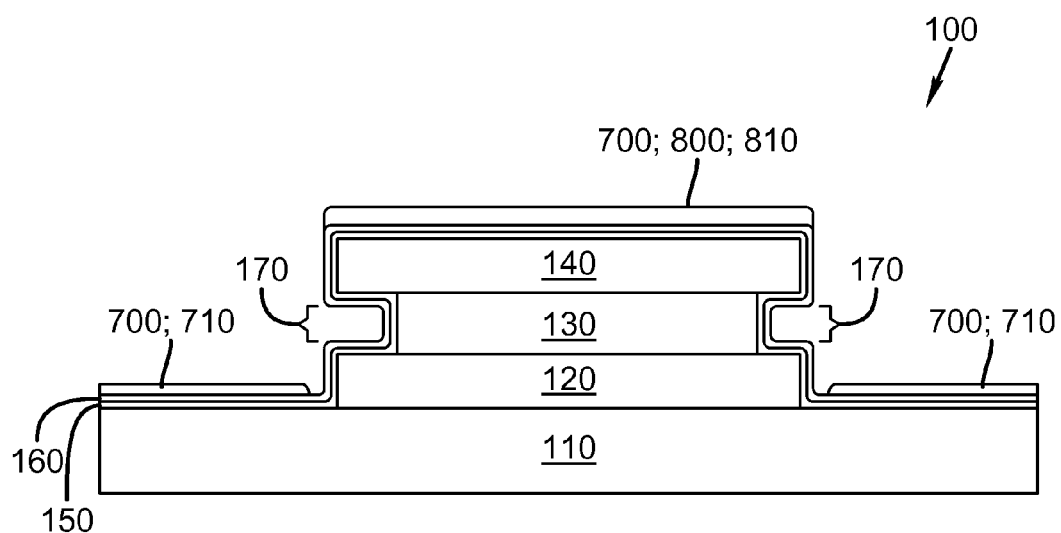
FIG. 1 is a schematic cross sectional view of a vertical transistor.

Referring to FIG. 1, a schematic cross sectional view of a vertical transistor 100 is shown. Transistor 100 includes a substrate 110, a first electrically conductive material layer 120, a second electrically conducting material layer 130, and a third electrically conducting material layer 140. Transistor 100 also includes another electrically insulating material layer 150, a semiconductor material layer 160, an electrode or electrodes 710, and an electrode 810.

Conductive layer 120 is positioned between substrate 110 and second conducting layer 130. A first surface of conductive layer 120 contacts a first surface of substrate 110 while a second surface of conductive layer 120 contacts a first surface of second electrically conductive layer 130. Second conductive layer 130 is positioned between first conducting layer 120 and third conducting layer 140. A first surface of second conductive layer 130 contacts a second surface of first conducting layer 120 while a second surface of conductive layer 130 contacts a first surface of third electrically conductive layer 140. Substrate 110, often referred to as a support, can be rigid or flexible.

Third conducting layer 140, second conductive layer 130, first conductive layer 120, or combinations thereof is appropriately dimensioned (or sized), positioned, or dimensioned and positioned relative to at least one other layer or substrate to create a reentrant profile 170 in transistor 100. As such, it can be said that at least a portion of one or more of third conducting layer 140, second conductive layer 130, and first conductive layer 120 defines the reentrant profile 170 of transistor 100. The reentrant profile 170 shields at least some of second conductive layer 130 from material deposited (or coated) using a directional (or line of sight) deposition (or coating) process. The reentrant profile 170 allows at least some of the second conductive layer 130 to be accessible to material deposited using a conformal deposition (or coating) process. For example, third electrically conducting material layer 140 and second electrically conductive material layer 130 define the reentrant profile 170.

As shown in FIG. 1, the reentrant profile 170 is defined by portions of one or both of third electrically conducting material layer 140 and second electrically conductive material layer 130. Third electrically conductive layer 140 is sized and positioned to extend beyond or overhang second conductive layer 130 such that third conducting layer 140 creates a reentrant profile 170 relative to second conductive layer 130. Alternatively stated, second conductive layer 130 is sized and positioned to end (in both the left and right directions as shown in FIG. 1) before third conducting layer 140 ends such that second conductive layer 130 creates a reentrant profile 170 relative to third conductive layer 140.

The first conducting layer 120 extends out (in both the left and right directions as shown in FIG. 1) from the second conducting layer 130 to provide electrical conduction under the reentrant profile 170. This configuration of transistor 100 provides switching of the semiconductor layer 160 in the regions under the reentrant profile closest to the substrate 110 that would otherwise be left ungated and act as a series resistor.

Insulating material layer 150 conforms to the reentrant profile 170 of transistor 100. Insulating material layer 150 includes first and second surfaces with the first surface being in contact with portions of exposed surfaces of third conducting layer 140, second conductive layer 130, first conductive layer 120, and substrate 110. Semiconductor material layer 160 conforms to the reentrant profile 170 of transistor 100. Semiconductor layer 160 includes first and second surfaces with the first surface being in contact with the second surface of insulating layer 150. Distinct (or separate, different) portions of the second surface of semiconductor layer 160 are in contact with electrode(s) 710 and electrode 810.

Electrode(s) 710 includes another (a fourth) electrically conductive material layer 700. Electrode 800 includes yet another (a fifth) electrically conductive material layer 800. Electrode(s) 710 and electrode 810 are positioned spaced apart from each other at different locations of transistor 100. The fourth and fifth electrically conductive material layers 700, 800 can be the same material layer. When this is done, electrode(s) 710 and electrode 810 are included in distinct discontinuous portions of the same electrically conductive material layer 700.

Electrically conductive material layers, 120,130 and 140 function as the gate of transistor 100. In some example embodiments of transistor 100, electrode(s) 710 functions as the drain of transistor 100 and electrode 810 functions as the source of transistor 100. In other example embodiments of transistor 100, electrode(s) 710 functions as the source and electrode 810 functions as the drain.

The semiconductor device is actuated in the following manner. After transistor 100 is provided, a voltage is applied between the fourth electrically conductive material layer 700 (electrode(s) 710) and the fifth electrically conductive material layer 800 (electrode 810). A voltage is also applied to the gate of transistor 100, for example, first electrically conductive material layer 120, to electrically connect the fourth electrically conductive material layer 700 (electrode(s) 710) and the fifth electrically conductive material layer 800 (electrode 810). As electrically conductive material layer 120 is in contact with electrically conductive material layer 130 and electrically conductive material layer 140, applying a voltage to electrically conductive material layer 120 is considered equivalent to applying a voltage to either or both of electrically conductive material layer 130 and electrically conductive material layer 140 or all three of the electrically conductive material layers.

The reentrant profile 170 of transistor 100 allows a dimension of the semiconductor material channel of the transistor to be associated, at least in part, with the thickness of the second conductive layer 130, which functions as a portion or all of the gate of transistor 100. Advantageously, this architecture of the present invention reduces reliance on high resolution or very fine alignment features during the manufacture of transistors that include small channels.

Referring to FIGS. 2 through 8B, schematic cross sectional views of process steps associated with an example embodiment of a method of manufacturing transistor 100 are shown.

Generally described, transistor 100 is fabricated in the following manner. A substrate 110 is provided including in order a first electrically conductive material layer 120, a second electrically conducting material layer 130, and a third electrically conducting material layer 140. A resist material layer 400 is applied over the third electrically conducting material layer 140. Resist material layer 400 is patterned to expose a portion of third electrically conducting material layer 140, shown in FIG. 2. The exposed portion of third electrically conducting material layer 140 is removed via a process such as plasma etching or wet etching to expose a portion of the second electrically conductive material layer 130. The exposed portion of the second electrically conductive material layer 130 is removed by another etching process to expose a portion of the first electrically conductive material 120. The exposed portion of the first electrically conductive material layer 120 is removed by another etching process to expose a portion of the substrate 110, shown in FIG. 3.

Figure 4:
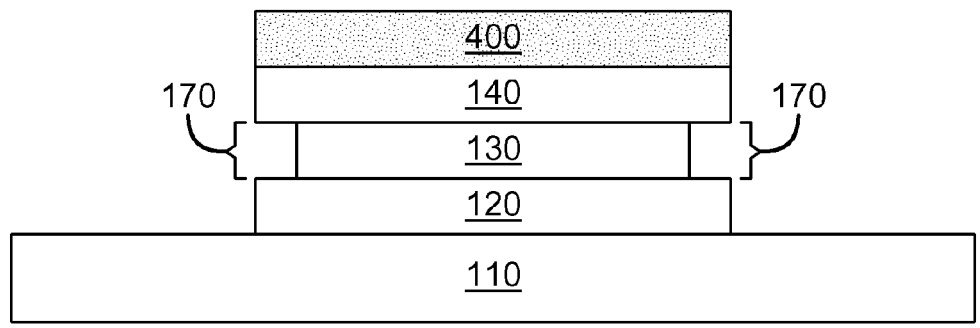

Further removal of second conductive material layer 130 creates a large reentrant profile 170, shown in FIG. 4. The reentrant profile 170 is created by the removal of some of second electrically conductive material layer 130 while some of third electrically conducting material layer 140 remains. In this sense, it can be said that the reentrant profile 170 is created in second conductive material layer 130 relative to third electrically conducting material layer 140. After removal of photoresist layer 400, shown in FIG. 5, if such is necessary, substrate 110 and the remaining exposed material layers 120, 130, 140 are conformally coated with an electrically insulating material layer 150, shown in FIG. 6. Electrically insulating material layer 150 is conformally coated with a semiconductor material layer 160, shown in FIG. 7. An electrically conductive material layer or layers, either material layer 700 or material layers 700 and 800, is directionally deposited over semiconductor material layer 160, shown in FIG. 8A using arrows 900, produce electrode(s) 710 and electrode 810, shown in FIG. 8B.

In another example embodiment, the resist material layer 400 can be deposited over third electrically conducting material layer 140 and patterned in the same process step. A liquid etchant can be used to remove the exposed portion of the third electrically conducting material layer 140 to expose a portion of the second electrically conductive material layer 130. The same liquid etchant that is used to remove the exposed portion of the third electrically conducting material layer 140 can be used to remove the exposed portion of the second electrically conductive material layer 130 to create the reentrant profile 170 in the second electrically conductive material layer 130. The same liquid etchant that is used to remove the exposed portion of the second electrically conducting material layer 130 can be used to remove the exposed portion of the first electrically conductive material layer 120 to expose the substrate 110, provided the etch rate of the second electrically conductive layer is faster than the first and third electrically conductive materials 120 and 140.

In some example embodiments, substrate 110 can include more than one material layer. The additional material layer(s) is included in some instances in order to improve or maintain the structural integrity of substrate 110 during the manufacturing process. When substrate 110 includes more than one material layer, for example, a first layer and a second layer, the fabrication method can include removing the second layer of substrate 110.

Figure 2:
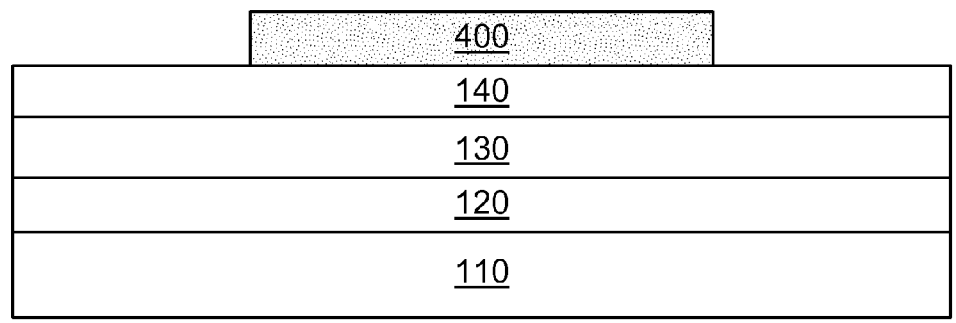
FIGS. 2 through 8B are schematic cross sectional views of process steps associated with an example embodiment of a method of producing the vertical transistor shown in FIG. 1.

Referring back to FIG. 2, a schematic cross sectional view of transistor 100 prior to material processing is shown. The manufacturing process for forming the vertical transistor device begins with a substrate 110 that is non-conductive, either in whole or in part with respect at least the portion of the substrate that is adjacent to first electrically conductive layer 120 (the top of the substrate 110 as shown in FIG. 2), so that electrical shorting of transistor 100 does not occur. First electrically conductive layer 120 is applied to or deposited onto substrate 110. Second electrically conductive layer 130 is applied to or deposited onto first electrically conductive layer 120. Third electrically conductive layer 140 is applied to or deposited onto second electrically conductive layer 130. Electrically conductive layers 120, 130, and 140 function as the gate of transistor 100 and define a length of the gate by its thickness (in the vertical direction as shown in FIG. 2). A resist layer 400 is applied to third electrically conductive layer 140. Resist 400 is patterned.

Substrate 110 does not interact appreciably with any of the material layers or the processing methods. Substrate 110, often referred to as a support, can be used for supporting the thin film transistor (also referred to as a TFT) during manufacturing, testing, or use. Those skilled in the art will appreciate that a support selected for commercial embodiments can be different from one selected for testing or screening embodiments. In some embodiments, substrate 110 does not provide any necessary electrical function for the TFT. This type of substrate 110 is termed a "non-participating support" herein. Useful substrate materials include organic or inorganic materials. For example, substrate 110 can include inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(ether sulfone) (PES), poly(phenylene sulfide) (PPS), and fiber-reinforced plastics (FRP). The thickness of substrate 110 can vary, typically from about 25 µm to about 1 cm.

A flexible support or substrate 110 is used in some example embodiments of the present invention. Using a flexible substrate 110 allows for roll processing, which can be continuous, providing economy of scale and economy of manufacturing over flat or rigid supports. The flexible support chosen is preferably capable of wrapping around the circumference of a cylinder of less than about 50 cm in diameter, more preferably 25 cm in diameter, and most preferably 10 cm in diameter, without distorting or breaking, using low force as by unaided hands. The preferred flexible support can be rolled upon itself. Additional examples of flexible substrates include thin metal foils such as stainless steel provided the foils are coated with an insulating layer to electrically isolate the thin film transistor. If flexibility is not a concern, then the substrate can be a wafer or sheet made of materials including glass and silicon.

In some example embodiments, substrate 110 can include a temporary support or support layer, for example, when additional structural support is desired for a temporary purpose, e.g., manufacturing, transport, testing, or storage. In these example embodiments, substrate 110 can be detachably adhered or mechanically affixed to the temporary support. For example, a flexible polymeric support can be temporarily adhered to a rigid glass support to provide added structural rigidity during the transistor manufacturing process. The glass support can be removed from the flexible polymeric support after completion of the manufacturing process.

The electrically conductive material layers 120, 130, and 140 commonly referred to as a conductor, can be any suitable conductive material that permits electrically conductive layers 120, 130, and 140 to function as a gate. A variety of gate materials known in the art are also suitable, including metals, degenerately doped semiconductors, conducting polymers, and printable materials such as carbon ink, silver-epoxy, or sinterable metal nanoparticle suspensions. For example, the gate electrode can include doped silicon, or a metal, such as aluminum, chromium, molybdenum, gold, silver, nickel, copper, tungsten, palladium, platinum, tantalum, and titanium. Gate electrode materials can also include transparent conductors such as indium-tin oxide (ITO), ZnO, SnO2, or In2O3. Conductive polymers also can be used, for example polyaniline, poly(3,4-ethylenedioxythiophene)/poly(styrene sulfonate) (PEDOT:PSS). In addition, alloys, combinations, and multilayers of these materials can be used.

The gate material layers, often referred to as a gate electrode, can be deposited on substrate 110 using chemical vapor deposition, sputtering, evaporation, doping, or solution processing. In some embodiments of the invention, the same material can provide the gate electrode function and also provide the support function of substrate 110 provided substrate 110 also includes an insulating layer to electrically isolate transistor 100. For example, doped silicon can function as a gate electrode layer and support the TFT.

The thickness (the vertical direction as shown in FIG. 2) of the gate electrode can vary, typically from about 100 to about 10000 nm. As the thickness of the second electrically conductive layer 130 defines the reentrant profile, as shown in FIG. 1, the thickness of the second electrically conductive layer 130 is usually thicker than twice the thickness of the conformally coated materials (the electrically insulating material layer and the semiconductor material layer) in order to maintain a reentrant profile and reduce the likelihood of electrical shorting.

Third electrically conductive layer 140 is coated with a resist 400 which is patterned. Resist 400 can be a conventional photoresist known in the art such as a polymeric positive acting resist or a negative resist. Resist 400 is exposed through a mask with a low resolution (>1 mm) alignment to substrate 110 and developed to yield a pattern of resist. In another example embodiment, the pattern of resist 400 is accomplished using a printing process, such as flexography or inkjet printing, which prints the resist directly in a patterned manner without using a mask.

Figure 3:
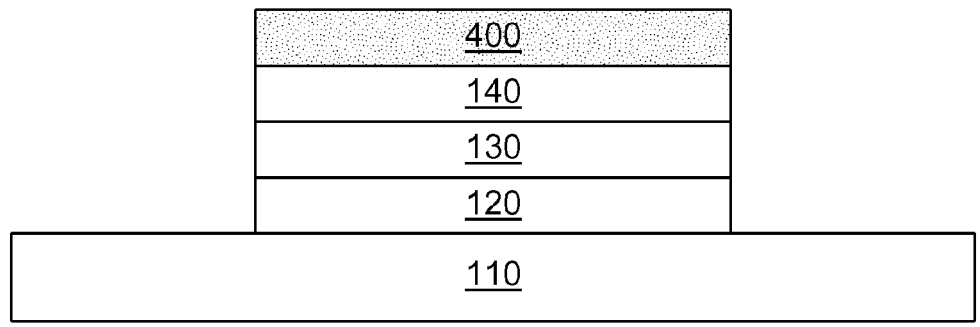

Referring back to FIGS. 3-5, a schematic cross sectional view of transistor 100 material layers during and after material processing are shown. In FIG. 3, third electrically conductive layer 140 is etched through patterned resist 400. The etchant can be any organic or inorganic material and used with a suitable process that removes the nonconductive material without substantial attacking resist 400 or the underlying second electrically conductive layer 130. The second electrically conductive layer 130 is then removed using a suitable etchant which removes the second electrically conductive layer 130 but has little impact on the first electrically conductive layer 120. The first electrically conductive layer 120 is then removed using a suitable etchant which removes the second electrically conductive layer 120 but has little impact on the substrate 110 or the overlying second electrically conductive layer 130. As such, the selected etchants often depends on the substrate 110, the first conductor, 120, the second conductor 130, and the third conductor 140. Etchant interaction with resist 400 and loss of the resist 400 after the etching of the third conductor 140 is usually of little consequence, since the third conductor 140 now acts as a mask. In FIG. 3, the etching process or processes used etch away portions of conductors 120, 130 and 140 such that they have the same pattern.

Figure 5:
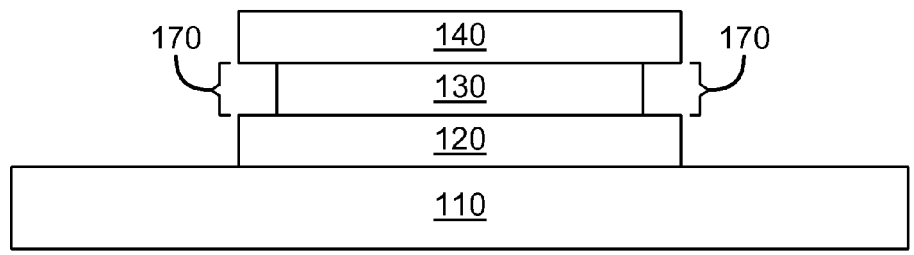

In FIG. 4, selective etching of second conductor 130 is continued until the reentrant profile 170 is formed. When etching of second conductor 130 is complete, third conductor 140 overhangs second conductor 130 which creates a reentrant profile 170 that is sufficient to shield at least some of the underlying surface (either conductor 120 or substrate 110) from coating by a directional (or line-of-sight) coating source positioned above substrate 110 (shown in FIG. 8A). Alternatively stated, second conductor 130 underhangs third conductor 140. The first conductor 120 typically protrudes as far as third conductor 140 after removal of second conductor 130 is complete. This prevents any semiconductor near the substrate 110 from not being gated when voltage is applied to the gate of the transistor 100 (conductors 120,130, and 140). At this point, if it is necessary, resist 400 is removed, as shown in FIG. 5. Gentle cleaning can be performed on the material layer stack, if desired, provided that the cleaning process does not remove the reentrant profile 170.

Figure 6:
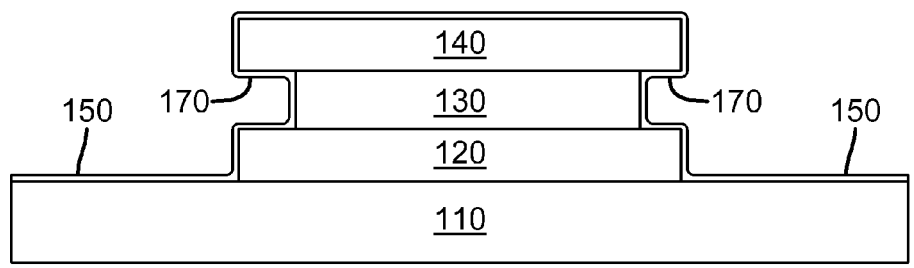

Referring back to FIGS. 6 and 7, schematic cross sectional views of the semi-conductor device after conformal coating of a dielectric nonconductive material, often referred to as an insulator, and a semiconductor material, respectively, are shown. A dielectric nonconductive material 150 is then conformally coated using a conformal coating deposition process over substrate 110 and the topographic feature formed by conductive material layers 120, 130, and 140, as shown in FIG. 6. Applying nonconductive material 150 using a conformal coating process helps to maintain the reentrant profile 170. Nonconductive material 150 is often referred to as the gate dielectric. Suitable nonconductive materials include strontiates, tantalates, titanates, zirconates, aluminum oxides, silicon oxides, tantalum oxides, titanium oxides, silicon nitrides, barium titanate, barium strontium titanate, barium zirconate titanate. As the dielectric material separates the gate conductor from the semiconductor material that is to be applied, it is important that the conformally coated material be provided with a consistent or uniform thickness at least in the region where the reentrant profile 170 and the gate are located.

Preferred processes for accomplishing conformal coating include atomic layer deposition (ALD) or one of its derivatives such as spatial ALD (S-ALD) or plasma enhanced ALD (PEALD) because these processes yield a uniform thickness coating over or on a highly varying topology. ALD and S-ALD are discussed in more detail below.

Figure 7:
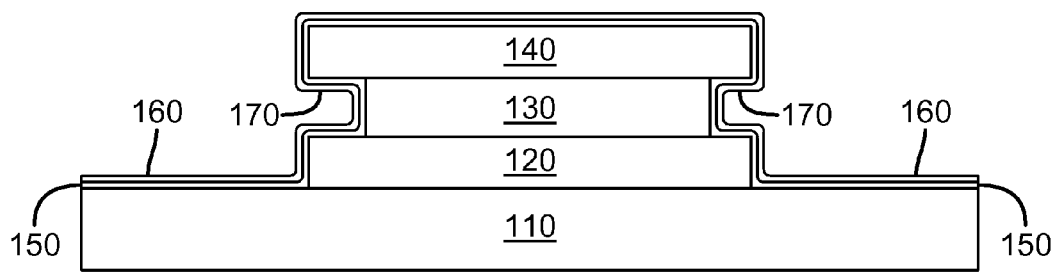
Figure 8A:
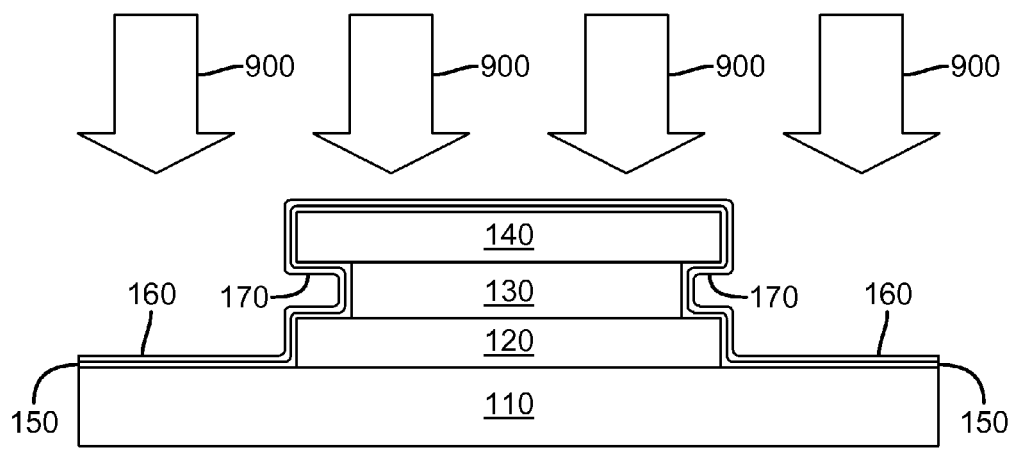
Figure 8B:
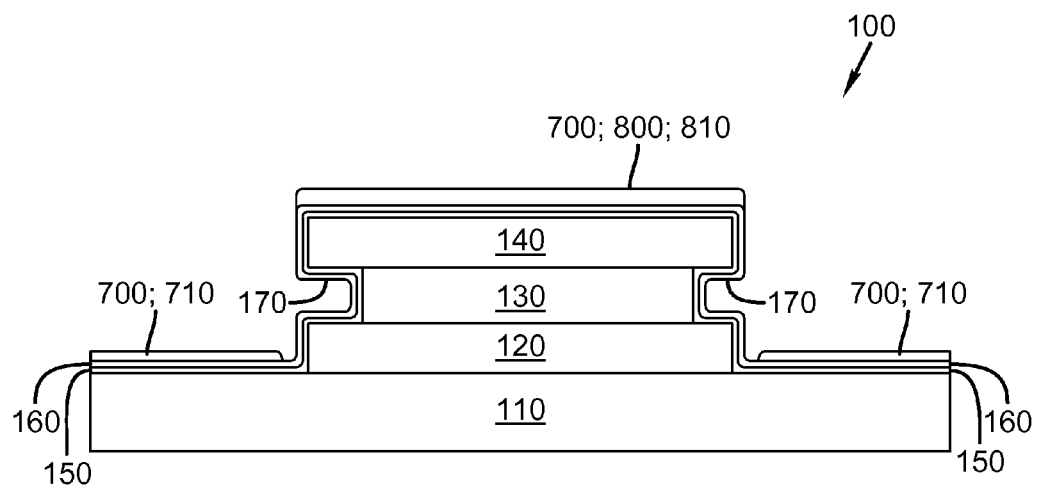

In FIG. 7, a semiconductor material 160 is then coated using a conformal coating deposition process which helps to maintain the reentrant profile 170. This conformal coating process can be the same process used previously to coat the dielectric material. Alternatively, the conformal coating process can be different. As the semiconductor material 160 acts as a channel between electrode(s) 710 and electrode 810 when gate conductor layers 120, 130 and 140 are energized, it is important that the conformally coated material be provided with a consistent or uniform thickness at least in the region where the reentrant profile 170 and the gate are located, and more preferably in the areas between electrode(s) 710 and electrode 810 including the area where the reentrant profile 170 and the gate are located. A preferred process for conformally coating is atomic layer deposition (ALD) or one of its derivatives such as spatial ALD (S-ALD). These processes yield a uniform thickness on a highly varying topology.

Atomic Layer Deposition (ALD) is a process which is used to produce coatings with thicknesses that can be considered consistent, uniform, or even exact. ALD produces coatings that can be considered conformal or even highly conformal material layers. Generally described, an ALD process accomplishes substrate coating by alternating between two or more reactive materials, commonly referred to as precursors, in a vacuum chamber. A first precursor is applied to react with the substrate. The excess of the first precursor is removed is removed from the vacuum chamber. A second precursor is then applied to react with the substrate. The excess of the second precursor is removed from the vacuum chamber and the process is repeated.

Recently, a new ALD process has been developed which negates the need for a vacuum chamber. This process, commonly referred to as S-ALD, is described in at least one of U.S. Pat. No. 7,413,982, U.S. Pat. No. 7,456,429, US 2008/0166884, and US 2009/0130858, the disclosures of which are incorporated by reference herein. S-ALD produces coatings with thicknesses that can be considered consistent, uniform, or even exact. S-ALD produces coatings that can be considered conformal or even highly conformal material layers. S-ALD is also compatible with a low temperature coating environment. Additionally, S-ALD is compatible with web coating, making it attractive for large scale production operations. Even though some web coating operations may experience alignment issues, for example, web tracking or stretching issues, the architecture of the present invention reduces reliance on high resolution or very fine alignment features during the manufacturing process. As such, S-ALD is well suited for manufacturing the present invention.

The semiconductor material layer 160, often referred to as a semiconductor, can be any type of semiconductor provided the semiconductor material can be deposited or coated using a conformal coating process such as ALD for example. Examples of suitable semiconductor materials include zinc oxide, zinc chalcogenides, cadmium chalcogenides, gallium pnictides, aluminum nictides, or silicon.

The semiconductor can optionally be doped with other materials to increase or decrease the conductivity. In some example embodiments, a depletion mode device is desirable, and therefore carriers can be added through the use of dopants. When the semiconductor is a zinc oxide, the use of an aluminum dopant, for example, increases the electron carrier density. In this configuration, the gate is typically used to turn off the device by making it negative relative to the drain and source.

A compensating dopant can also be used to deplete the intrinsic carrier density. When the semiconductor is zinc oxide, the use of nitrogen has been found to decrease the electron carrier density making it less n-type. In this configuration, the semiconductor can be made to operate in an accumulation mode to turn on the transistor when a positive gate voltage is applied. These dopants are often added as compounds during the growth process but can also be added after the semiconductor layer has been applied using a process such as ion implantation and thermal diffusion.

Referring back to FIG. 8A, a schematic cross sectional view of the semi-conductor device during directional coating of an electrically conductive material is shown. After semiconductor layer 160 has been deposited, the source and drain electrode(s) 710 and electrode 810 are formed by depositing electrically conductive material layer 700 or depositing material layer 700 and electrically conductive material layer 800 using a directional (or line-of-sight) deposition process which does not deposit or coat material into the reentrant profile 170. Examples of suitable directional deposition processes include thermal evaporation, electron beam evaporation, sputtering, or laser ablation. The active channel gap between electrode(s) 710 and electrode 810 is maintained by the shadow casted by the overhang of third electrically conductive layer 140 relative to second electrically conductive material layer 130.

Referring back to FIG. 8B, transistor 100 after electrode(s) 700 and electrode 800 have been deposited is shown. The drain and the source of transistor 100 can be selected from either of electrode 710 or electrode 810 with the selection typically being based on the application and the characteristics of the contemplated device. Electrode 810 is on the top of the mesa formed by conductors 140, 130, and 120 while electrode(s) 710 is not. As such, electrode(s) 710 and electrode 810 are on different planes. Any necessary interconnects can be accomplished using conventional techniques, for example, layer leveling and via feed through, well known in the art.

Substrate 110, first electrically conductive layer 120, second electrically conductive layer 130, third electrically conductive layer 140, nonconductive layer 150, semiconductor layer 160, or combinations thereof can include one or more layers provided the functional aspect of the layer remains unchanged. Any number of additional layers, for example, leveling layers, barrier layers, adhesion layer, can be included in the semiconductor device as long as the function of the layers described above is preserved.

EXPERIMENTAL RESULTS

Example 1

A 117 nm layer of chromium was deposited via sputtering evaporation on a 62.5 mm square glass substrate. On top of this, a 300 nm aluminum layer was coated deposited via sputtering. Another 117 nm layer of chromium was deposited via sputtering on the sample.

A patterned layer of photoresist was formed by spin coating at 1000 rpm Microposit S1805 resist (Rohm and Haas Electronic Materials LLC, Marlborough, Mass.) placed on a hot plate for 60 sec at 115 degrees Celsius and then exposed through a glass/chromium contact mask including lines for 75 seconds on a Cobilt mask aligner (Cobilt model CA-419 from Computervision Corporation, Sunnyvale, Calif.), using only the edges of the glass substrate as a low resolution or crude alignment. The sample was then developed for 80 seconds in Microposit MF-319 developer (Rohm and Haas Electronic Materials LLC, Marlborough, Mass.) and rinsed for 5 minutes in DI water.

The exposed chromium was etched for 1.75 minutes at room temperature in a chromium etch consisting of a 0.6M solution of ceric ammonium nitrate in 18% acetic acid. The aluminum layer was then etched at 60 degrees Celsius with concentrated phosphoric acid for 1.33 minutes. The exposed chromium was etched for 0.75 minutes at room temperature in chromium etch. Further etching of the aluminum to form the reentrant profile was accomplished with further etching of the aluminum at 60 degrees Celsius with concentrated phosphoric acid for 0.5 minutes.

The substrate was then conformally coated with a layer 60 nm thick of aluminum oxide at 200 degrees Celsius using the S-ALD process described in U.S. Pat. No. 7,413,982 and the S-ALD apparatus described in U.S. Pat. No. 7,456,429 with the organo-metallic precursors trimethyl aluminum and water with an inert carrier gas of nitrogen. Then, the substrate was coated with a 25 nm layer of zinc oxide at 200 degrees Celsius using the precursors diethyl zinc and concentrated ammonia solution and nitrogen as the carrier gas.

The electrodes were applied by evaporation. Aluminum was evaporated through a shadow mask including square holes which ran perpendicular and completely cross each line on the substrate. The aluminum was 70 nm thick.

Figure 9A:
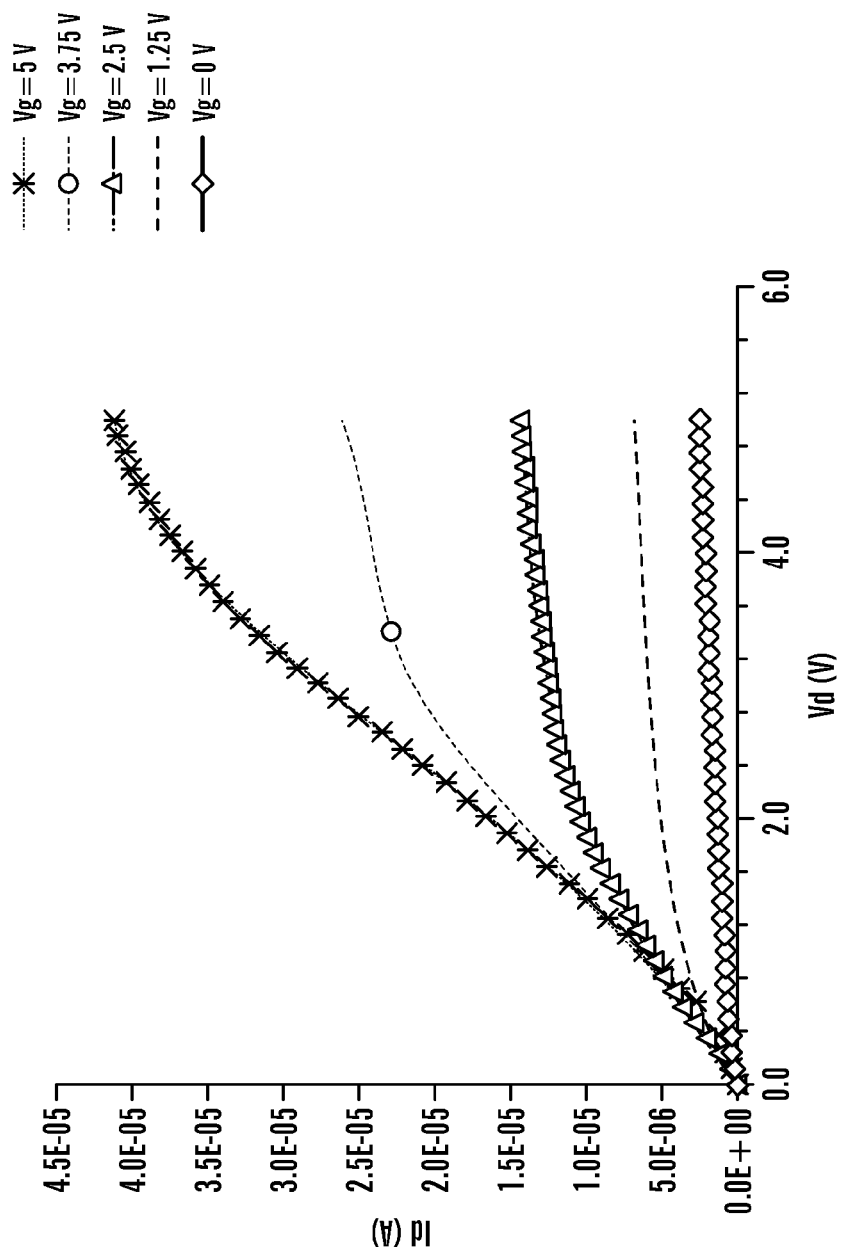
FIG. 9A is a graph showing performance $I_d$-$V_d$ curve characteristics for a first example embodiment of the vertical transistor shown in FIG. 1.
Figure 9B:
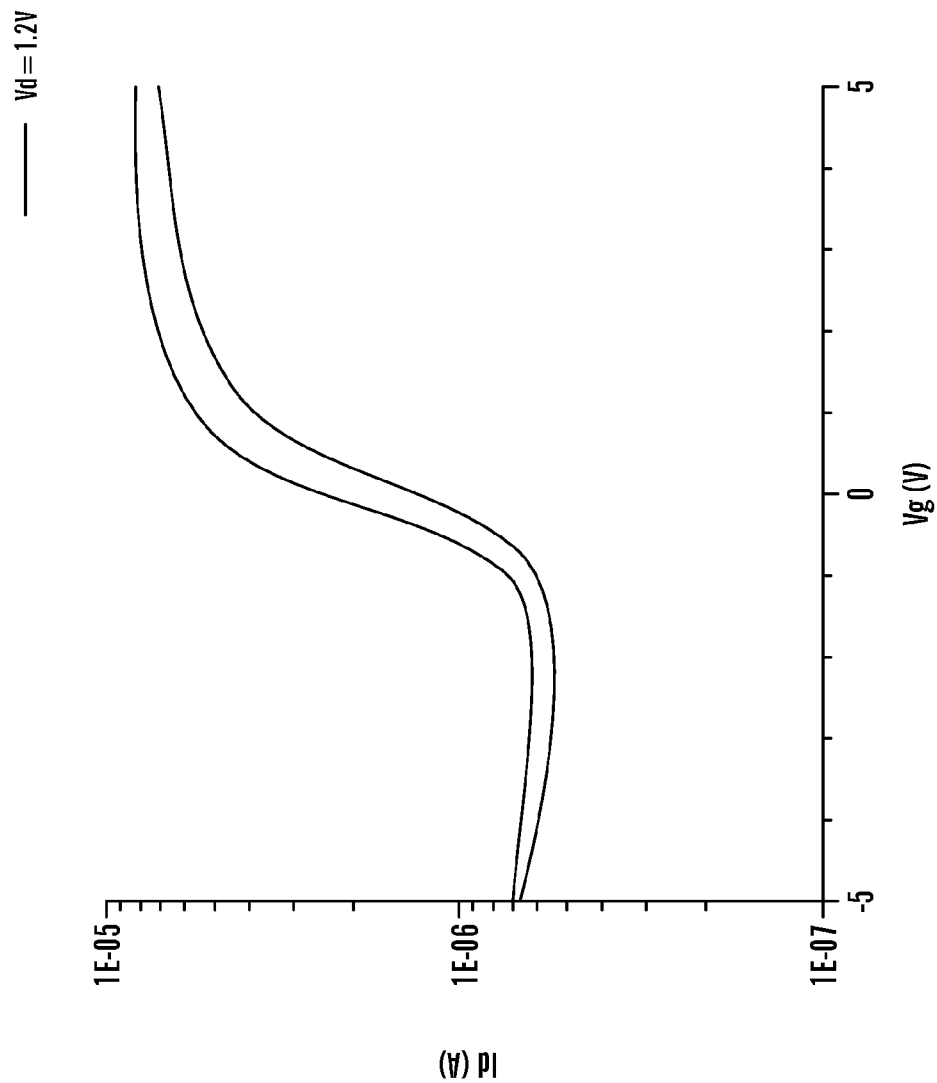
FIG. 9B is a graph showing performance transfer characteristics for the first example embodiment of the vertical transistor shown in FIG. 1.

Testing of the transistor was accomplished by using a probe station to contact the aluminum on top of the line, the aluminum on one side of the line and the chromium gate metal which acts as the gate. Referring to FIG. 9A, a graph showing performance $I_d$-$V_d$ curve characteristics for the transistor is shown. As can be seen, the drain current versus drain voltage is a function of the gate voltage. Referring to FIG. 9B, it can also be seen that the drain current responds to the gate voltage, ranging from about $6 \times 10^{-7}$ amps at a gate of −2 volts to almost $10^{-5}$ amps at a gate of 2 volts and a drain voltage of 1.2 V.

Example 2

A 140 nm layer of aluminum was deposited via thermal evaporation on a 62.5 mm square glass substrate. On top of this, a 460 nm molybdenum layer was coated deposited via sputtering. A 140 nm layer of aluminum was deposited via thermal evaporation on the sample.

A patterned layer of photoresist was formed by spin coating at 1000 rpm Microposit S1805 resist (Rohm and Haas Electronic Materials LLC, Marlborough, Mass.) placed on a hot plate for 60 sec at 115 degrees Celsius and then exposed through a glass/chromium contact mask including lines for 75 seconds on a Cobilt mask aligner (Cobilt model CA-419 from Computervision Corporation, Sunnyvale, Calif.), using only the edges of the glass substrate as a low resolution or crude alignment. The sample was then developed for 80 seconds in Microposit MF-319 developer (Rohm and Haas Electronic Materials LLC, Marlborough, Mass.) and rinsed for 5 minutes in DI water. This not only developed the photoresist but also etched through the exposed aluminum.

The exposed molybdenum was plasma etched with 0.3 torr SF6 at 200 W for 10 minutes using a PEII-A plasma etcher (Technics West Inc.). The aluminum was then etched at 60 degrees Celsius with concentrated phosphoric acid for 20 seconds. The substrate was then rinsed in DI water for 5 minutes, then rinsed in HPLC grade isopropanol, and then allowed to dry. The molybdenum was further plasma etched with 0.3 ton SF6 at 200 W for 3 minutes to create the reentrant profile. The photoresist was removed using acetone and washed with DI water and isopropanol, and then allowed to dry.

The substrate was then conformally coated with a layer 60 nm thick of aluminum oxide at 200 degrees Celsius using the S-ALD process described in U.S. Pat. No. 7,413,982 and the S-ALD apparatus described in U.S. Pat. No. 7,456,429 with the organo-metallic precursors trimethyl aluminum and water with an inert carrier gas of nitrogen. Then substrate was coated with a 25 nm layer of zinc oxide at 200 degrees Celsius using the precursors diethyl zinc and concentrated ammonia solution and nitrogen as the carrier gas.

The electrodes were applied by evaporation. Aluminum was evaporated through a shadow mask including square holes which ran perpendicular and completely cross each line on the substrate. The aluminum was 70 nm thick.

Figure 10A:
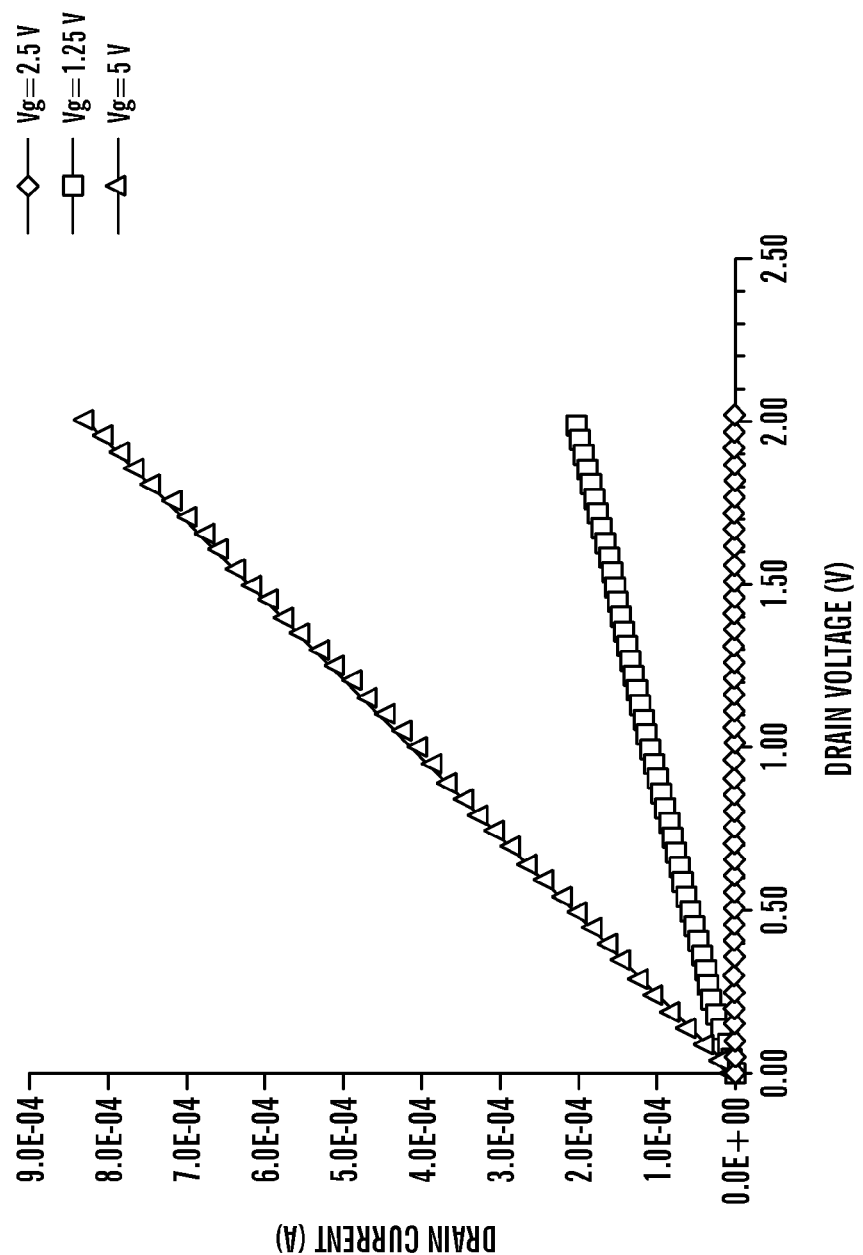
FIG. 10A is a graph showing performance $I_d$-$V_d$ curve characteristics for a second example embodiment of the vertical transistor shown in FIG. 1.
Figure 10B:
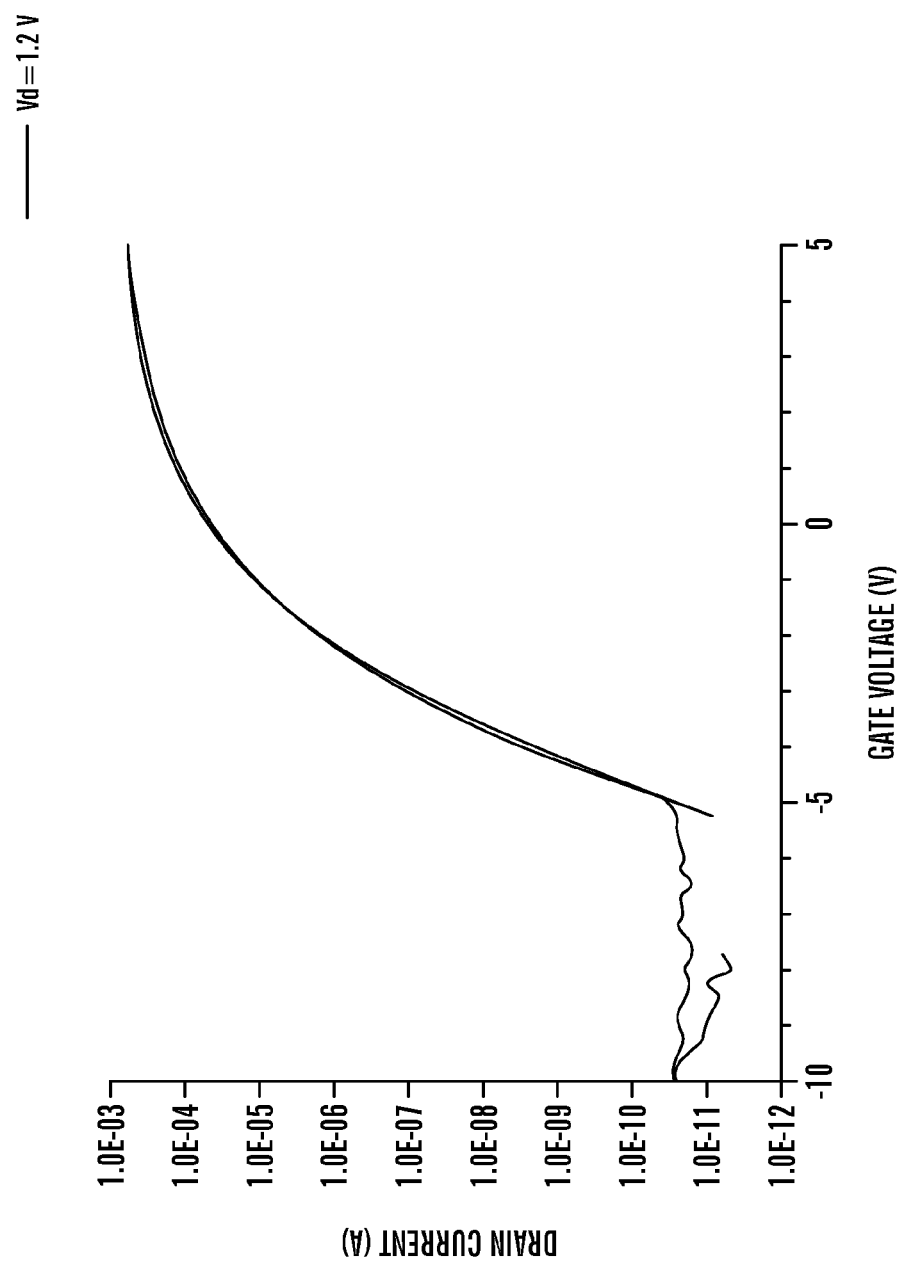
FIG. 10B is a graph showing performance transfer characteristics for the second example embodiment of the vertical transistor shown in FIG. 1.

Testing of the transistor was accomplished by using a probe station to contact the aluminum on top of the line, the aluminum on one side of the line and the aluminum/molybdenum gate metal which acts as the gate. Referring to FIG. 10A, a graph showing performance $I_d$-$V_d$ curve characteristics for the transistor is shown. As can be seen, the drain current versus drain voltage is a function of the gate voltage and is very responsive to the gate voltage. Referring to FIG. 10B, it can also be seen that the drain current responds well to the gate voltage, ranging from an off-current of about $10^{-11}$ amps at a gate of −5 volts to almost a milliamp at a gate of 5 volts and a drain voltage of 1.2 V.

The invention has been described in detail with particular reference to certain preferred embodiments thereof, but it will be understood that variations and modifications can be effected within the scope of the invention.

PARTS LIST 100 transistor
110 substrate
120 first electrically conductive layer
130 second electrically conductive layer
140 third electrically conductive layer
150 electrically insulating material layer
160 semiconductor material layer
170 reentrant profile
400 resist
700 fourth electrically conductive layer
710 electrode
800 fifth electrically conductive layer
810 electrode
900 directional deposition arrow

The invention claimed is:

1. A method of producing a transistor comprising:
providing a substrate including in order a first electrically conductive material layer, a second electrically conductive material layer, and a third electrically conductive material layer, the first electrically conductive material layer being in contact with the second electrically conductive material layer, the second electrically conductive material layer being in contact with the third electrically conductive material layer;
depositing a resist material layer over the third electrically conductive material layer;
patterning the resist material layer to expose a portion of the third electrically conductive material layer;
removing some of the third electrically conductive material layer to expose a portion of the second electrically conductive material layer;
causing the third electrically conductive material layer to overhang the second electrically conductive material layer by removing some of the second electrically conductive material layer; and
removing some of the first electrically conductive material layer.

2. The method of claim 1, further comprising:
conformally coating the third electrically conductive material layer, the second electrically conductive material layer, the first conductive material layer, and at least a portion of the substrate with an electrically insulating material layer.

3. The method of claim 2, further comprising:
conformally coating the electrically insulating material layer with a semiconductor material layer.

4. The method of claim 3, the second electrically conductive material layer having a thickness, the electrically insulating material layer having a thickness, the semiconductor material layer having a thickness, wherein the thickness of the second electrically conductive material layer is greater than two times the sum of the thicknesses of the electrically insulating material layer and the semiconductor material layer.

5. The method of claim 3, further comprising:
directionally depositing a fourth electrically conductive material layer over portions of the semiconductor material layer.

6. The method of claim 1, wherein the first electrically conductive material layer extends beyond the second electrically conductive material layer.

7. The method of claim 1, wherein the substrate is flexible.

8. The method of claim 1, wherein depositing the resist material layer over the third electrically conductive material layer and patterning the resist material layer occur in the same process step.

9. The method of claim 1, wherein causing the third electrically conductive material layer to overhang the second electrically conductive material layer by removing some of the second electrically conductive material layer includes using a liquid etchant.

10. The method of claim 1, the substrate including a first layer and a second layer, the method further comprising:
removing the second layer of the substrate.

11. The method of claim 1, wherein causing the third electrically conductive material layer to overhang the second electrically conductive material layer by removing some of the second electrically conductive material layer includes using a plasma etchant.

12. The method of claim 1, wherein the first electrically conductive material layer extends beyond the third electrically conductive material layer.

* * * * *